(12) United States Patent
Chu

(10) Patent No.: US 7,079,054 B2
(45) Date of Patent: Jul. 18, 2006

(54) V.42BIS STANDALONE HARDWARE ACCELERATOR AND ARCHITECTURE OF CONSTRUCTION

(75) Inventor: Hon Fai Chu, Sunnyvale, CA (US)

(73) Assignee: Broadcom Corporation, Irvine, CA (US)

( * ) Notice: Subject to any disclaimer, the term of this patent is extended or adjusted under 35 U.S.C. 154(b) by 78 days.

(21) Appl. No.: 10/919,907

(22) Filed: Aug. 17, 2004

(65) Prior Publication Data

US 2005/0270188 A1 Dec. 8, 2005

Related U.S. Application Data

(60) Provisional application No. 60/577,358, filed on Jun. 4, 2004.

(51) Int. Cl.
*H03M 7/30* (2006.01)
*G06F 7/00* (2006.01)
*G06F 15/00* (2006.01)
*G06F 15/76* (2006.01)
*G06F 17/00* (2006.01)

(52) U.S. Cl. .......................... 341/87; 707/101; 712/24
(58) Field of Classification Search ................ 341/87, 341/51, 67, 79, 106; 710/316; 712/24, 200; 714/711; 340/7.53; 382/232; 707/100, 707/101; 708/203

See application file for complete search history.

(56) References Cited

U.S. PATENT DOCUMENTS

| | | | | |
|---|---|---|---|---|
| 5,151,697 A | * | 9/1992 | Bunton | 341/51 |
| 5,396,228 A | * | 3/1995 | Garahi | 340/7.53 |
| 5,412,384 A | * | 5/1995 | Chang et al. | 341/79 |
| 5,627,533 A | * | 5/1997 | Clark | 341/51 |
| 5,673,042 A | * | 9/1997 | Yoshida et al. | 341/51 |
| 5,692,139 A | * | 11/1997 | Slavenburg et al. | 710/316 |
| 5,737,732 A | * | 4/1998 | Gibson et al. | 707/2 |
| 5,754,556 A | * | 5/1998 | Ramseyer et al. | 714/711 |
| 5,951,623 A | * | 9/1999 | Reynar et al. | 708/203 |
| 6,026,478 A | * | 2/2000 | Dowling | 712/24 |
| 6,104,323 A | * | 8/2000 | Cho | 341/51 |
| 6,115,716 A | * | 9/2000 | Tikkanen et al. | 707/100 |

(Continued)

OTHER PUBLICATIONS

Clark Thomborson, The V.42bis Standard for Data-Compressing Modems, Vol. 12, Issue 5, Oct. no date 1992; pp. 41-53, IEEE Computer Society Press, Los Alamitos, CA, USA, The Institute of Electrical & Electronics Engineers, USA.

*Primary Examiner*—Patrick Wamsley
(74) *Attorney, Agent, or Firm*—McAndrews, Held & Malloy, Ltd.

(57) ABSTRACT

Methods and systems for on-chip processing of data are disclosed. Aspects of the method may include generating a plurality of data processing commands for data compression. A first string of characters may be encoded in one operating cycle utilizing the generated plurality of data processing commands for data compression. The plurality of data processing commands may comprise a branch command, a register moving command, a register setting command, a memory load command, a memory store command, and/or a register compare command. The generated plurality of data processing commands may be stored. At least a portion of the stored data processing commands may be decoded. The decoded portion of the stored data processing commands may be sequenced. The first string of characters may be acquired from a character space. The acquired first string of characters may be matched with at least one existing codeword.

36 Claims, 13 Drawing Sheets

U.S. PATENT DOCUMENTS

| | | | |
|---|---|---|---|
| 6,359,548 B1 * | 3/2002 | Cooper | 341/50 |
| 6,404,362 B1 * | 6/2002 | York et al. | 341/106 |
| 6,597,812 B1 * | 7/2003 | Fallon et al. | 382/232 |
| 6,750,791 B1 * | 6/2004 | Liu | 341/87 |
| 6,779,101 B1 * | 8/2004 | Berg et al. | 712/24 |
| 6,859,870 B1 * | 2/2005 | Kim et al. | 712/24 |
| 6,892,292 B1 * | 5/2005 | Henkel et al. | 712/200 |
| 6,903,668 B1 * | 6/2005 | Dror et al. | 341/67 |
| 6,927,706 B1 * | 8/2005 | Horie | 341/51 |
| 6,961,011 B1 * | 11/2005 | Matthews | 341/87 |

* cited by examiner

400b

422

V.42BIS STANDALONE HARDWARE ACCELERATOR AND ARCHITECTURE OF CONSTRUCTION

CROSS-REFERENCE TO RELATED APPLICATIONS/INCORPORATION BY REFERENCE

This application makes reference to, claims priority to, and claims the benefit of U.S. Provisional Patent Application 60/577,358, filed on Jun. 4, 2004 and entitled "V.42bis Standalone Hardware Accelerator And Architecture Of Construction," the complete subject matter of which is hereby incorporated herein by reference in its entirety.

FIELD OF THE INVENTION

Certain embodiments of the invention relate to encoding and decoding of data. More specifically, certain embodiments of the invention relate to a V.42bis standalone hardware accelerator and architecture of construction.

BACKGROUND OF THE INVENTION

Recommendation for the V.42bis standard was approved by the International Telegraph and Telephone Consultative Committee on Jan. 31, 1990 as an addition to the v.42 error-correction protocol for modems. The V.42bis standard utilizes a variant of the Lempel-Ziv-Welch (LZW) compression algorithm and describes a data compression standard for use with modems and v-Series data circuit terminating equipment (DCE), including handheld devices such as mobile telephones. The LZW compression algorithm used in the V.42bis compression procedure encodes strings of characters into codewords. During decoding, strings of characters may be generated from received codewords. The V.42bis standard may be implemented in modem hardware, for example, as well as in software that interfaces to a non-compressing modem. In this manner, a device utilizing the V.42bis standard may be adapted to send both compressed and non-compressed data.

In accordance with the V.42bis standard, a plurality of processing commands may be utilized during encoding and/or decoding of a string of characters. A processor operating in a conventional V.42bis environment may execute one processing command in one operating cycle. During encoding and decoding operations that are performed according to the V.42bis standard, there may be processing commands that are continuously repeated during operating cycles of a DCE. In addition, during the encoding and/or decoding operations in a V42bis compliant environment, many types of memory modules may be utilized, such as on-chip and off-chip memory modules. Such continuous repetition of the data processing commands and the execution of one processing command in one operating cycle, as well as the utilization of different types of memory modules, may lead to a significant increase in CPU processing time, CPU overload and reduction in the overall device processing speed and efficiency.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

Certain embodiments of the invention may be found in a method and system for on-chip processing of data. Aspects of the method may include generating a plurality of data processing commands for data compression. A first string of characters may be encoded in one operating cycle utilizing the generated plurality of data processing commands for data compression. The plurality of data processing commands may comprise a branch command, a register moving command, a register setting command, a memory load command, a memory store command, and/or a register compare command. The generated plurality of data processing commands may be stored and at least a portion of the stored data processing commands may be decoded. The decoded portion of the stored data processing commands may then be sequenced.

The first string of characters may be acquired from a character space and matched with at least one existing codeword. The matched existing codeword may be stored into a codeword space. If the acquired first string of characters does not match the existing codeword, a new codeword may be generated corresponding to the acquired first string of characters. A plurality of data processing commands for data decompression may be generated. At least one codeword may be decoded in one operating cycle utilizing the generated plurality of data processing commands for data decompression. The codeword may be matched with a second string of characters, and the matched second string of characters may be stored into a character space.

Another embodiment of the invention may provide a machine-readable storage, having stored thereon, a computer program having at least one code section executable by a machine, thereby causing the machine to perform the steps as described above, for on-chip processing of data.

Aspects of the system for on-chip processing of data may include an accelerator that generates a plurality of data processing commands for data compression. The accelerator may encode a first string of characters in one operating cycle utilizing the generated plurality of data processing commands for data compression. The plurality of data processing commands may comprise at least one of a branch command, a register moving command, a register setting command, a memory load command, a memory store command, and/or a register compare command. The accelerator may store the generated plurality of data processing commands and may decode at least a portion of the stored data processing commands. The accelerator may sequence the decoded portion of the stored data processing commands.

The accelerator may acquire the first string of characters from a character space and may match the acquired first string of characters with at least one existing codeword. The accelerator may then store the matched existing codeword into a codeword space. If the acquired first string of characters does not match the existing codeword, the accelerator may generate a new codeword corresponding to the acquired first string of characters. The accelerator may generate a plurality of data processing commands for data decompression and may decode at least one codeword in one operating cycle utilizing the generated plurality of data processing commands. The accelerator may match the codeword with a second string of characters and the matched second string of characters may be stored into a character space.

These and other advantages, aspects and novel features of the present invention, as well as details of an illustrated

DETAILED DESCRIPTION OF THE INVENTION

Figure 1A:
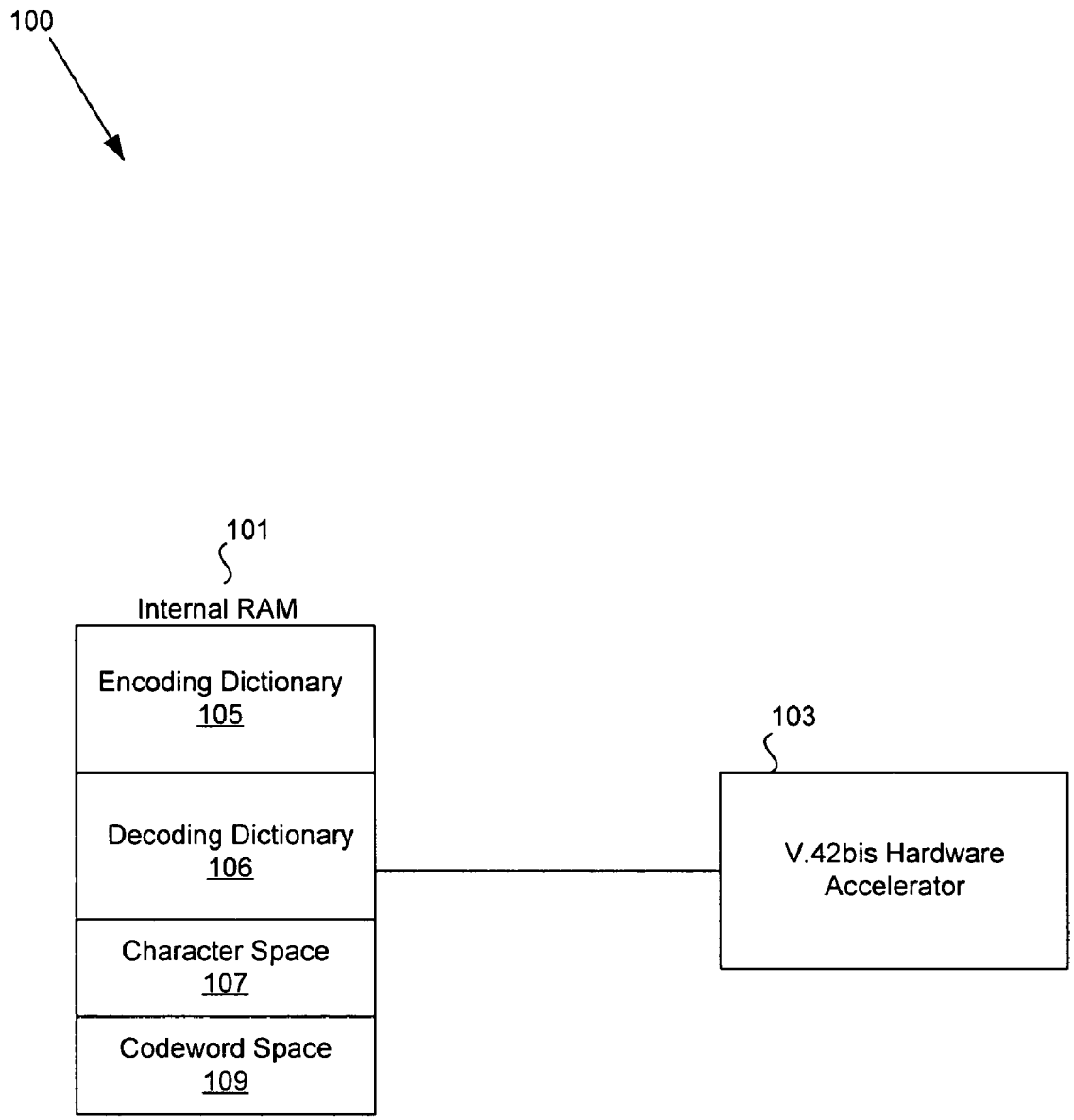
FIG. 1A is a block diagram of internal memory organization utilizing V.42bis hardware accelerator, in accordance with an embodiment of the invention.

Certain embodiments of the invention may be found in a method and system for on-chip processing of data. A hardware accelerator may be provided that performs a substantial portion of encoding and decoding operations that may be required during V.42bis processing of data. The hardware accelerator may be adapted to offload certain processing tasks from an internal memory and to process such processing tasks in one operating cycle. For example, compression and decompression operations according to the V.42bis standard may be repeated numerous times during data processing. The repeating compression/decompression operations may be performed on-chip by a V.42bis hardware accelerator, for example, to achieve increased data processing efficiency. In one aspect of the invention, a V.42bis hardware accelerator may perform a plurality of compression/decompression processing commands in a single operating cycle. In this manner, redundant operations within a DCE, for example, may be reduced and on-chip data processing time may be decreased. As a result, on-chip resources, including memory modules, may be accessed faster and utilized more efficiently and effectively. A processor, or a digital signal processor (DSP) may control the operation of a V.42bis hardware accelerator for added efficiency.

The hardware accelerator may generate a plurality of data processing commands for data compression. During compression, a string of characters may be encoded in one operating cycle utilizing the data processing commands. The plurality of data processing commands may be executed by the accelerator as a single very long instruction word (VLIW). The data processing commands within a VLIW may include a branch command, a register moving command, a memory load command, a memory store command, and/or a register compare command, for example. The hardware accelerator may be adapted to store a plurality of VLIWs, each corresponding to a different plurality of data processing commands.

During a V.42bis encoding process, a codeword may be generated from a string of characters by matching the string of characters with codewords within an on-chip dictionary, such as an encoding dictionary. The on-chip dictionary may comprise an encoding dictionary and a decoding dictionary used during encoding and decoding, respectively. If the string of characters is matched with a codeword within the on-chip encoding dictionary, the corresponding codeword may be saved within a codeword space for further processing, such as output. If the string of characters is not matched with a codeword within the on-chip encoding dictionary, the hardware accelerator may utilize one or more VLIWs to encode the string of characters and generate a corresponding codeword. The on-chip encoding dictionary may then be updated with the generated codeword.

During a V.42bis decoding process, a codeword may be decoded in one operating cycle, for example, to obtain one or more corresponding strings of characters. More specifically, data processing commands generated by a hardware accelerator may be utilized within a VLIW during the decoding process. A codeword may be decoded in one operating cycle by the hardware accelerator utilizing the VLIW. During decoding, the codeword may be initially matched against a plurality of character strings within the on-chip decoding dictionary. If the codeword is matched with a string of characters within the on-chip decoding dictionary, the corresponding string of characters may be saved within a character space for further processing, such as output. If the codeword is not matched with a character string within the on-chip decoding dictionary, the hardware accelerator may utilize one or more VLIWs to decode the codeword and generate a corresponding character stream. The on-chip decoding dictionary may then be updated with the generated character stream.

FIG. 1A is a block diagram of internal memory organization 100 utilizing V.42bis hardware accelerator, in accordance with an embodiment of the invention. Referring to FIG. 1A, the internal memory organization 100 may comprise internal RAM 101 and a V.42bis hardware accelerator 103. The internal RAM 101 may comprise an encoding dictionary 105, a decoding dictionary 106, a character space 107 and a codeword space 109.

The encoding dictionary 105 comprises suitable circuitry, logic and/or code and may be adapted to store codewords. Each codeword may comprise 9, 10 and/or 11 bits, for example, and may correspond to one or more alphanumeric characters. The encoding dictionary 105 may be utilized during encoding of strings of characters into codewords. More specifically, the dictionary 105 may be utilized to match a string of characters to a corresponding codeword, prior to compression. Each string of characters corresponding to a codeword may be saved as a separate dictionary entry within the encoding dictionary 105. The matched corresponding codeword may then be stored in the codeword space 109 for further processing, such as output.

The decoding dictionary 106 comprises suitable circuitry, logic and/or code and may be adapted to store one or more alphanumeric characters that correspond to codewords. The decoding dictionary 106 may be utilized during decoding of strings of characters into codewords. During a V.42bis decoding process, the decoding dictionary 106 may be utilized to match a codeword with a string of characters. The matched corresponding string of characters may then be stored in the character space 107 for further processing, such as output.

The character space 107 comprises suitable circuitry, logic and/or code and may be adapted to store one or more alphanumeric characters for input during encoding and/or for output during decoding. The alphanumeric characters stored in the character space 107 may form strings of characters to facilitate codeword recognition by the decoding dictionary 106 during a V.42bis decoding process, for example. After a codeword is decoded, the corresponding character stream may be stored in the character space 107 for further processing, such as outputting the character stream.

The codeword space 109 comprises suitable circuitry, logic and/or code and may be adapted to store one or more codewords for input during decoding and/or for output during encoding. The codewords stored in the codeword space 108 may facilitate character recognition by the encoding dictionary 105 during a V.42bis encoding process, for example. After a string of characters is encoded, the corresponding codeword may be stored in the codeword space 107 for further processing, such as outputting the corresponding codeword.

The V.42bis hardware accelerator 103 comprises suitable circuitry, logic and/or code and may be utilized during a V.42bis encoding and/or decoding for providing necessary operational commands. In one aspect of the invention, the V.42bis hardware accelerator 103 may generate a plurality of operational commands that may be implemented as a single very long instruction word (VLIW). The VLIW may be used by the hardware accelerator 103 to encode a string of characters and/or to decode a codeword in one operational cycle. An operational cycle may be associated with one CPU clock cycle of the data processing device containing the internal RAM 101 and the V.42bis hardware accelerator 103.

During a V.42bis encoding operation, one or more alphanumeric characters may be obtained from the character space 107 and may be matched by the encoding dictionary 105 to one or more codewords. If the string of characters is matched with a corresponding codeword within the encoding dictionary 105, the resulting matched codeword may be stored in the codeword space 109 for further processing, such as outputting the codeword. If the encoding dictionary 105 does not have a matching codeword entry, the V.42bis hardware accelerator 103 may utilize a VLIW to encode the string of characters. In this manner, a new codeword may be generated by the V.42bis hardware accelerator 103. After the new codeword is generated, it may be stored, together with the corresponding string of characters, into the encoding dictionary 105 so that it may be available for any future encoding. Since the encoding dictionary 105 may initially contain only a limited number of basic codewords, after each encoding cycle the encoding dictionary 105 may be adapted to update its codeword content by storing codewords generated by the V.42bis hardware accelerator 103.

During a V.42bis decoding operation, one or more codewords may be obtained from the codeword space 109 and may be matched by the decoding dictionary 106 to one or more alphanumeric characters. If the codeword is matched with a corresponding string of characters within the decoding dictionary 106, the resulting matched string of characters may be stored in the character space 107 for further processing, such as outputting the string of characters. If the decoding dictionary 106 does not have a matching alphanumeric character entry, the V.42bis hardware accelerator 103 may utilize a VLIW to decode the codeword. In this manner, a new string of characters may be generated by the V.42bis hardware accelerator 103. After the new string of characters is generated, it may be stored, together with the corresponding codeword, into the decoding dictionary 106 so that it is available for any future decoding. Since the decoding dictionary 106 may initially contain only a limited number of alphanumeric characters, after each decoding cycle the decoding dictionary 106 may be adapted to update its alphanumeric characters content by storing strings of characters generated by the V.42bis hardware accelerator 103.

Figure 1B:
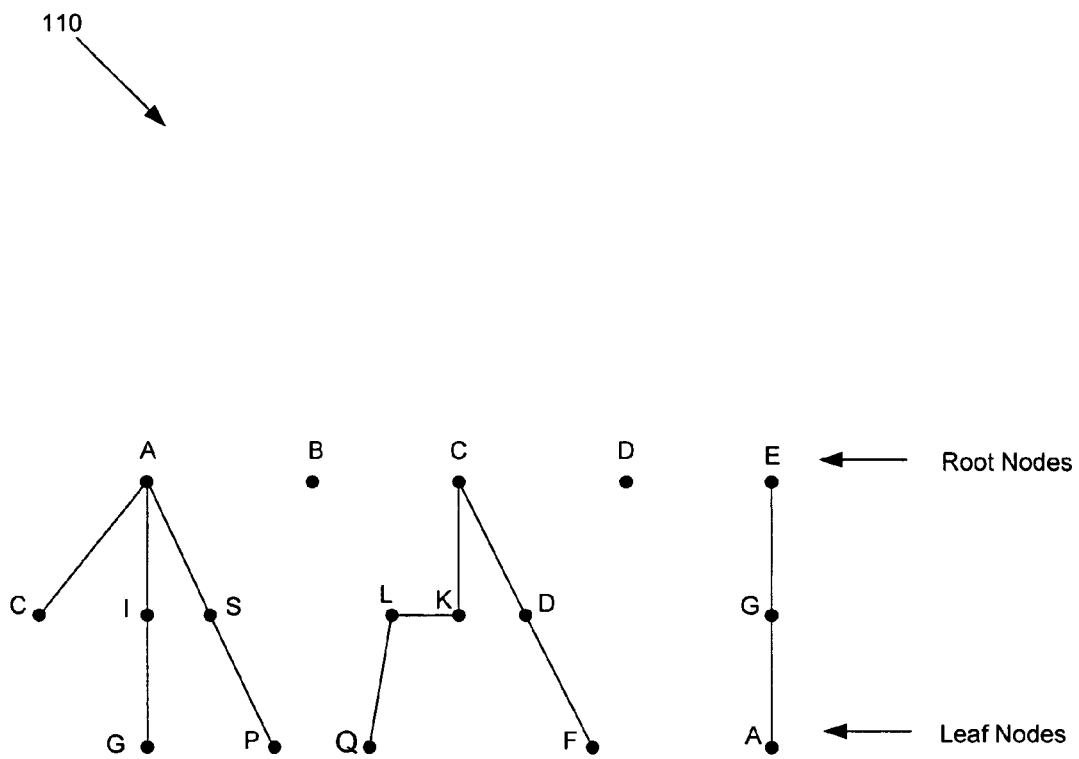
FIG. 1B is an exemplary tree-based representation of a dictionary that may be utilized in accordance with an embodiment of the invention.

FIG. 1B is an exemplary tree-based representation 110 of a dictionary that may be utilized in accordance with an embodiment of the invention. Referring to FIG. 1B, there is illustrated an abstract data structure representation of a dictionary that may be utilized during a V.42bis encoding and/or decoding process, such as the encoding dictionary 105 and the decoding dictionary 106 of FIG. 1A.

In one aspect of the invention, a dictionary used in accordance with a V.42bis encoding and/or decoding may contain a set of trees, as shown in FIG. 1B, each with a root corresponding to a single American Standard Code for Information Interchange (ASCII) character, or a total of 256 possible ASCII characters for each root. A dictionary tree may represent a set of known character strings beginning with one specific character, and each node or point in the tree may represent one set of character strings. For example, the character trees in FIG. 1B may represent character strings AC, AI, AIG, AS, ASP, B, CK, CKL, CKLQ, CD, CDF, D, EG and EGA.

Referring again to FIG. 1B, characters A, B, C, D and E have no parent represented by a hierarchically higher level in the tree and may, therefore, be referred to as root nodes. Within the root node A, for example, characters C, I and S may be referred to as A's children, or A may be referred to as a parent for nodes C, I and S. Lower level nodes G, P, Q, F and A have no dependent nodes and may be referred to as leaf nodes. Node L has a leaf node Q but has no parent node directly connected to it. Node L may, therefore, be referred to as the brother of node K, both nodes L and K having root node C as a parent. Node K may also be referred to as the youngest child from the children group {K; L} since only node K has a direct connection with the parent node C.

By utilizing a character tree structure, such as the character tree structure of FIG. 1B, an encoding and/or a decoding dictionary utilized during V.42bis encoding and/or decoding may be adapted to store one or more alphanumeric characters as separate dictionary entries. In addition, corresponding codewords may be associated with and may uniquely identify strings of characters. The codewords may also be stored in such encoding and/or decoding dictionary to facilitate V.42bis processing. In this manner, a codeword may be easily matched with a string of characters, for example in a decoding dictionary, and a string of characters may be easily matched with a corresponding codeword, for example in an encoding dictionary.

Figure 1C:
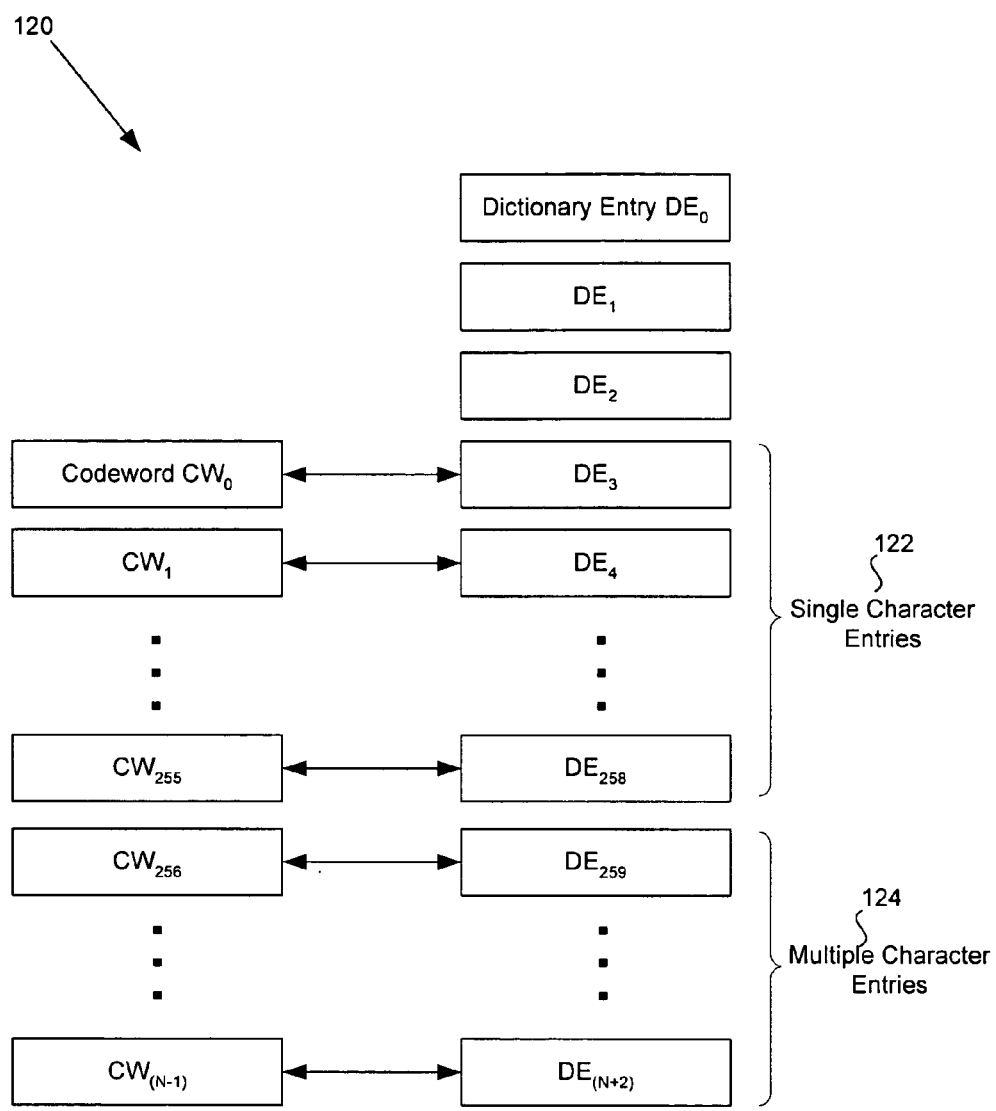
FIG. 1C is a block diagram of an exemplary dictionary structure, in accordance with an embodiment of the invention.

FIG. 1C is a block diagram of an exemplary dictionary structure 120, in accordance with an embodiment of the invention. Referring to FIG. 1C, the dictionary structure 120 may comprise a plurality of single character entries 122 and a plurality of multiple character entries 124. Dictionary entries DE0 through DE2 may be reserved for command functions relating to dictionary management and structure. For example, DE0 through DE2 may be utilized if the dictionary is expanded and additional entry space may be required.

In one aspect of the invention, an encoding and/or a decoding dictionary, such as the encoding dictionary 105 and/or the decoding dictionary 106 of FIG. 1A, may be adapted to store N number of codewords, CW0 through CW(N−1), and corresponding N number of dictionary entries, DE3 through DE(N+2). Each codeword CW0 through CW(N−1) may comprise 9, 10 and/or 11 bits, and may be referred to as a dictionary index entry. Each dictionary entry DE3 through DE(N+2) may store one or more alphanumeric characters. For example, the first 256 dictionary entries, or the single character entries 122, DE3 through DE258, may each store a single ASCII character. All subsequent dictionary entries, the multiple character entries 124, DE259 through DE(N+2), may each store a string of characters corresponding to a codeword. Both the codeword and the dictionary entries may be represented with a tree diagram, as illustrated in FIG. 1B.

Figure 1D:
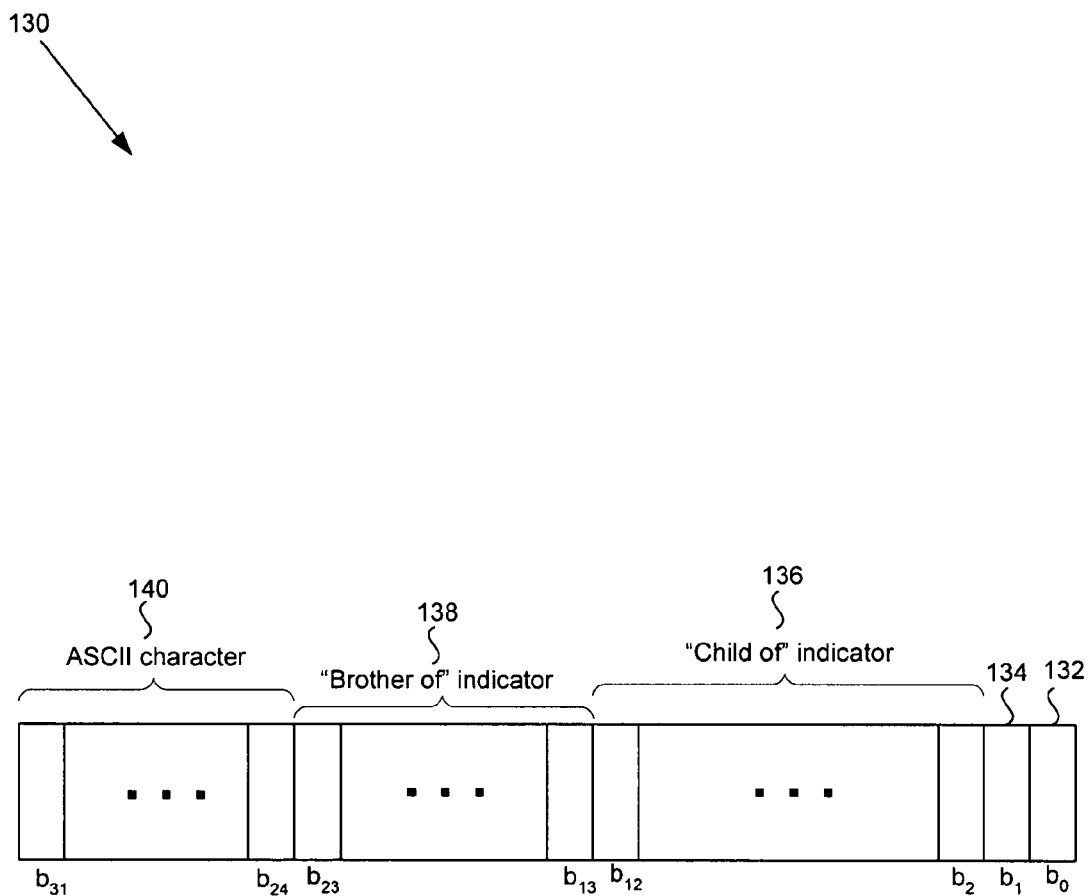
FIG. 1D is a block diagram of an exemplary dictionary entry within the dictionary structure of FIG. 1C, in accordance with an embodiment of the invention.

FIG. 1D is a block diagram of an exemplary dictionary entry 130 within the dictionary structure of FIG. 1C, in accordance with an embodiment of the invention. Referring to FIG. 1D, the dictionary entry 130 may comprise a total of 32 bits, b0 through b31, for example.

Bits b24 through b31 may be utilized to store an ASCII character 140 associated with the dictionary entry 130. For example, if the dictionary entry 130 comprises a single character dictionary entry, the ASCII character 140 may represent the single character associated with the dictionary entry 130. However, if the dictionary entry 130 comprises a multiple character dictionary entry, the ASCII character 140 may represent the first of the characters, within the string of characters, associated with the dictionary entry 140.

Bits b13 through b23 may be utilized to store a "brother of" indicator 138. The "brother of" indicator 138 may indicate whether the ASCII character 140 is a brother of another character node within a dictionary tree node structure. Similarly, bits b2 through b12 may be utilized to store a "child of" indicator 136. The "child of" indicator 136 may indicate whether the ASCII character 140 is a child of another character node within a dictionary tree node structure.

Bit b0 may store a leaf node information 132 and bit b1 may store a youngest child information 134. The leaf node information 132 may indicate whether or not the ASCII character 140 within the dictionary entry 130 is a leaf node. Similarly, the youngest child information 134 may indicate whether the ASCII character 140 within the dictionary entry 130 is a youngest child node.

By utilizing a dictionary entry structure as illustrated on FIG. 1D, the tree node structure within a decoding and/or encoding dictionary may be efficiently accessed during a V.42bis decoding and/or encoding process. For example, if dictionary entry 130 comprises a single character dictionary entry, only bits b24 through b31 may be utilized as the ASCII character information 140 may represent the single ASCII character associated with the dictionary entry 130.

If the dictionary entry 130 comprises a multiple characters dictionary entry, then the ASCII character information 140 may identify the first character within the string of characters. The remaining dictionary entry information, the "brother of" indicator 138, the "child of" indicator 136, the youngest child information 134 and the leaf node information 132, may identify any additional characters within the character node tree of the ASCII character 140. In this manner, a leaf node and/or a root node may be identified for the ASCII character 140, as well as any nodes located between a leaf node and a root node for the ASCII character 140.

In one aspect of the invention, V.42bis encoding and/or decoding may utilize matching a string of characters against an existing string of characters within an encoding and/or a decoding dictionary. A string of characters may be matched with a dictionary entry by first matching their leaf nodes and then each subsequent hierarchically higher level node. If there is a full match, a corresponding codeword, for example, may be obtained.

Figure 2:
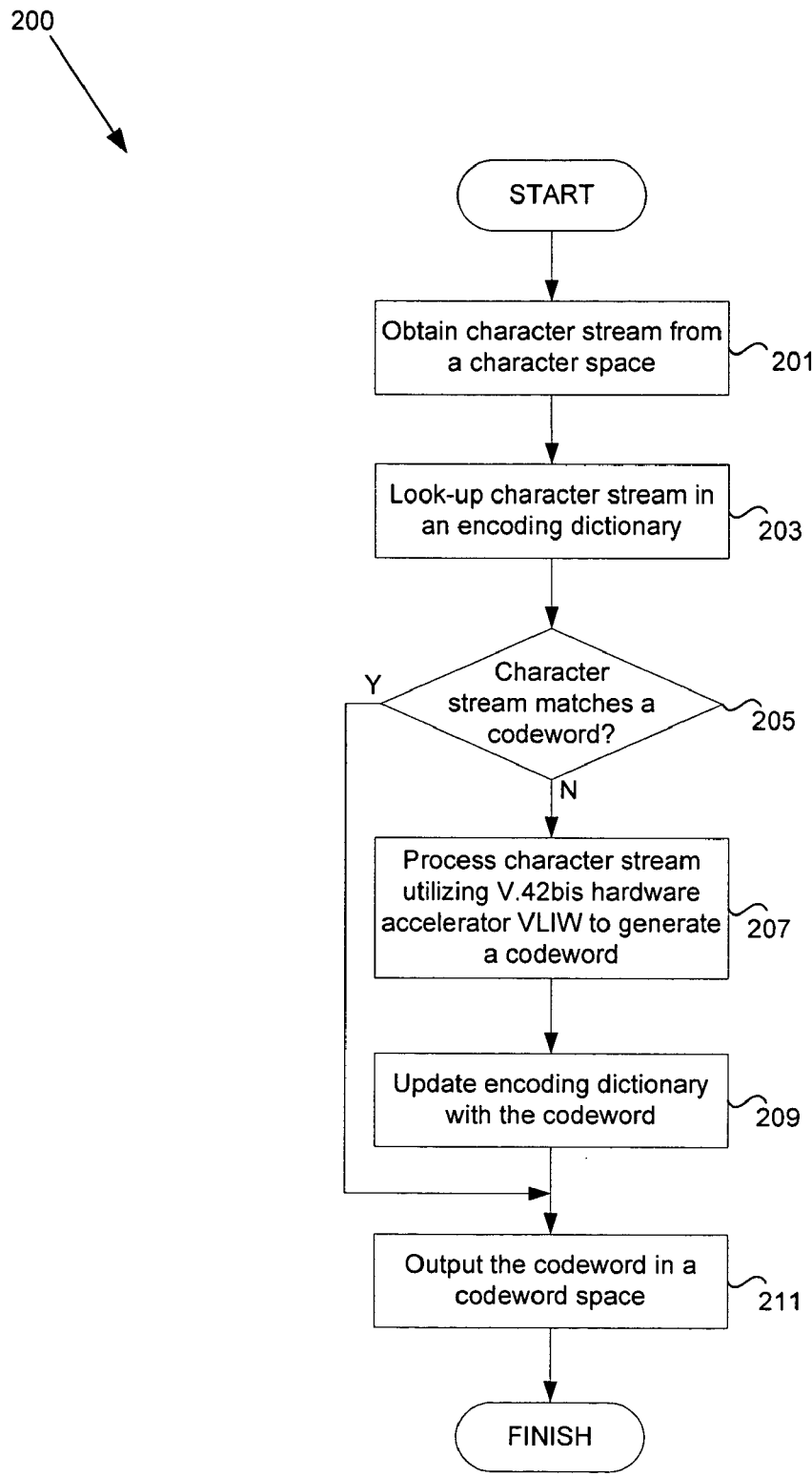
FIG. 2 is a flow diagram of an exemplary method for encoding a string of characters utilizing a V.42bis hardware accelerator, in accordance with an embodiment of the invention.

FIG. 2 is a flow diagram of an exemplary method 200 for encoding a string of characters utilizing a V.42bis hardware accelerator, in accordance with an embodiment of the invention. Referring to FIG. 2, at 201, a single character or a character stream may be obtained from a character space, for example. At 203, the obtained character stream may be referenced with entries in an encoding dictionary. At 205, it may be determined whether the character stream matches any codewords within the encoding dictionary. If the character stream matches a codeword within the encoding dictionary, at 211, the codeword may be outputted and stored in a codeword space for further processing.

If the character stream does not match any characters within the encoding dictionary, at 207, the character stream may be encoded utilizing a very long instruction word (VLIW), for example, from a V.42bis hardware accelerator to generate a corresponding codeword. At 209, the encoding dictionary may be updated with the generated codeword. At 211, the codeword may be outputted and stored in a codeword space for further processing.

Figure 3:
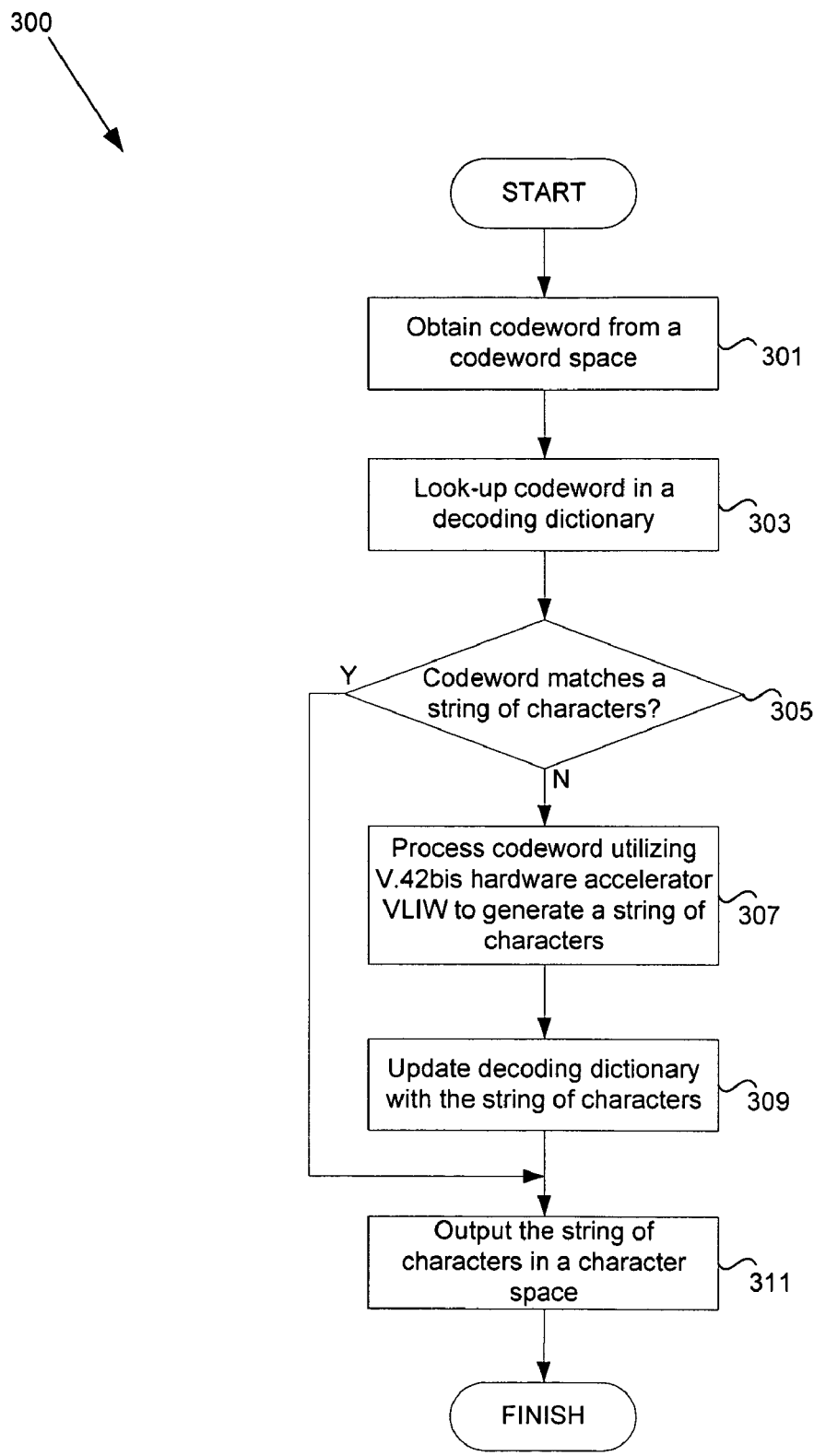
FIG. 3 is a flow diagram of an exemplary method for decoding an encoded string of characters utilizing a V.42bis hardware accelerator, in accordance with an embodiment of the invention.

FIG. 3 is a flow diagram of an exemplary method for decoding an encoded string of characters utilizing a V.42bis hardware accelerator, in accordance with an embodiment of the invention. Referring to FIG. 3, at 301, a codeword may be obtained from a codeword space, for example. At 303, the obtained codeword may be referenced with entries in a decoding dictionary. At 305, it may be determined whether the codeword matches any strings of characters within the decoding dictionary. If the codeword matches a string of characters, at 311, the string of characters may be outputted and stored in a character space for further processing.

If the codeword does not match any strings of characters within the decoding dictionary, at 307, the codeword may be decoded utilizing a very long instruction word (VLIW), for example, from a V.42bis hardware accelerator to generate a corresponding string of characters. At 309, the decoding dictionary may be updated with the generated string of characters. At 311, the string of characters may be outputted and stored in a character space for further processing.

Figure 4A:
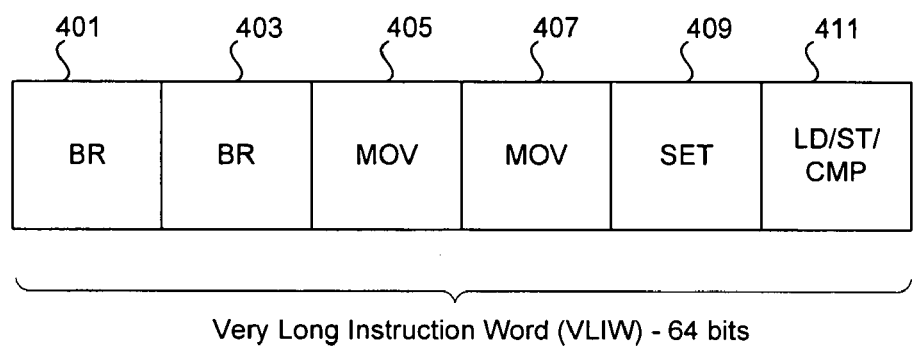
FIG. 4A is a block diagram of an exemplary V.42bis hardware accelerator very long instruction word (VLIW), in accordance with an embodiment of the invention.

FIG. 4A is a block diagram of an exemplary V.42bis hardware accelerator very long instruction word (VLIW) 400, in accordance with an embodiment of the invention. Referring to FIG. 4A, the V.42bis hardware accelerator VLIW 400 may comprise 64 bits and may include a plurality of command instructions used for encoding and/or decoding during V.42bis processing. For example, the VLIW 400 may comprise two branch (BR) commands 401 and 403, two register moving (MOV) commands 405 and 407, a register setting (SET) command 409 and an additional command 411. The additional command 411 may include a memory load (LD) command, a memory store (ST) command or a register compare (CMP) command.

In operation, a VLIW, such as the VLIW 400, may be generated and utilized by a V.42bis hardware accelerator within a data processing device during V.42bis encoding and/or decoding operations. The VLIW 400 may comprise several processing commands and may be executed by a central processing unit (CPU), or a digital signal processor (DSP), within the data processing device during a single operational cycle. Even though the VLIW 400 may comprise 64 bits, the invention is not limited in this manner. For example, other command words with different bit-sizes may also be utilized. In addition, a command word utilized by a V.42bis hardware accelerator may include other combinations of operational commands.

Figure 4B:
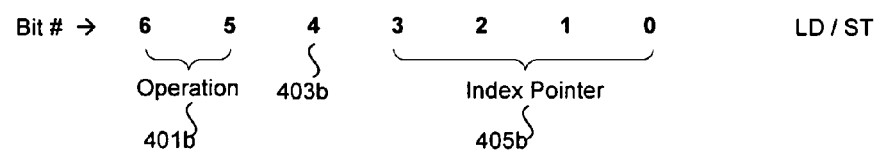
FIG. 4B is a diagram of an exemplary bit arrangement in a LOAD/STORE/COMPARE command within the VLIW of FIG. 4A, in accordance with an embodiment of the invention.
Figure 4B:
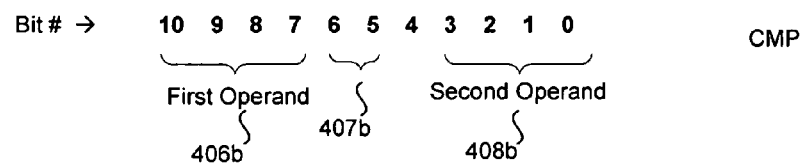

FIG. 4B is a diagram of an exemplary bit arrangement 400b in a LOAD/STORE/COMPARE command within the VLIW of FIG. 4A, in accordance with an embodiment of the invention. Referring to FIG. 4B, a load (LD) or a store (ST) command within a VLIW may comprise 7 bits, whereas a compare (CMP) command may comprise 11 bits. More specifically, an LD or ST command may comprise an index pointer 405b stored in bit 0 through bit 3, a register selection indicator 403b stored in bit 4 and an operation 401b stored in bits 5 and 6. The ST command may be applied to a register within a V.42bis hardware accelerator and/or a dictionary entry or a codeword entry within a decoding and/or encoding dictionary. The index pointer information 405b may be associated with the following accelerator registers and/or dictionary entries:

| REGISTER | DICTIONARY ENTRY |
|---|---|
| iSelf | nextCodeword |
| iNext | prevCodeword |
| iLast | charToIndex |
| iPrevious | |
| iTemp | |
| eSelf_brother | |
| IncReg | |
| eSelf_Child | |
| eOld_Brother | |
| eOld_Child | |

The register selection indicator 403b may refer to eSelf or eOld registers, for example. The eSelf and eOld registers may comprise 32-bit registers within a V.42bis hardware accelerator that may be associated with 32-bit dictionary entries. The operation 401b may comprise the following operation codes:

NOP, for no operation
CMP, for compare
ST, for store
LD, for load

The compare command CMP may be utilized to compare two operand values, a first operand 406b and a second operand 408b. Bit 4 may be left unused and bits 5 and 6 may comprise a command. For example, bits 5 and 6 may comprise an indicator value 407b indicating the compare CMP command. The operand values 406b and 408b may be associated with the following registers, referring to dictionary entries, and/or constant values:

| REGISTERS | CONSTANTS |
|---|---|
| iSelf | Length |
| iNext | maxLength |
| iLast | zero |
| iParent | one |
| iPrevious | seventeen |
| iTemp | |
| eSelf_brother | |
| eSelf_child | |
| eOld_brother | |
| eSelf_Char | |
| eOld_child | |

Figure 4C:
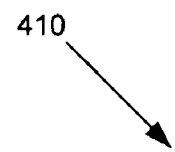
FIG. 4C is a diagram of an exemplary bit arrangement in a SET command within the VLIW of FIG. 4A, in accordance with an embodiment of the invention.
Figure 4C:
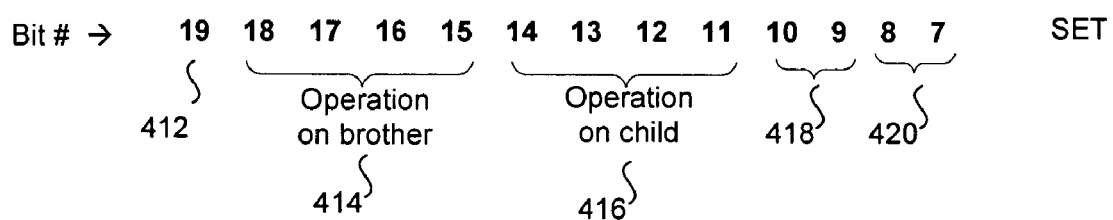

FIG. 4C is a diagram of an exemplary bit arrangement in a SET command 410 within the VLIW of FIG. 4A, in accordance with an embodiment of the invention. Referring to FIG. 4C, a SET command 410 within a VLIW used for V.42bis encoding and/or decoding may comprise 13 bits. More specifically, the SET command 410 may comprise a leaf flag 420, a youngest flag 418, operation on a child indicator 416, operation on a brother indicator 414 and a register indicator 412.

In one aspect of the invention, a SET command 410 may be utilized by a V.42bis hardware accelerator to change a value of an encoding and/or decoding dictionary entry to a different value. The register indicator 412 may indicate whether eSelf or eOld registers may be utilized during the SET operation, where eSelf and eOld may comprise 32-bit registers associated with 32-bit dictionary entries. The youngest flag 418 and the leaf flag 420 may indicate operations associated with a youngest character node and with a leaf character node within a dictionary tree structure. For example, the youngest flag 418 and the leaf flag 420 may include the following operations: None, Set and/or Clear.

The SET operations on a brother 414 and operations on a child 416 may be associated with a brother and/or a child node, respectively, within a dictionary tree structure. These set operations may comprise the following:

| OPERATION | DEFINITION |
|---|---|
| set2zero | set to zero |
| set2iSelf | set to content of register iSelf |
| set2iNext | set to content of register iNext |
| set2iLast | set to content of register iLast |
| set2iParent | set to content of register iParent |
| set2iPrevious | set to content of register iPrevious |
| set2iTemp | set to content of register iTemp |
| set2nextCodeword | set content equal to next codeword |
| set2eSelf_brother | set to content of register eSelf_brother |
| set2eSelf_child | set to content of register eSelf_child |
| set2eOld_brother | set to content of register eOld_brother |
| set2eOld_child | set to content of register eOld_child |
| set2CharToIndex | set to content of register CharToIndex |
| set2nop | set to no operation |

Figure 4D:
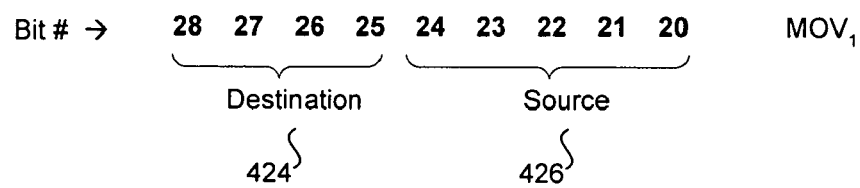
FIG. 4D is a diagram of an exemplary bit arrangement in a MOVE command sequence within the VLIW of FIG. 4A, in accordance with an embodiment of the invention.
Figure 4D:
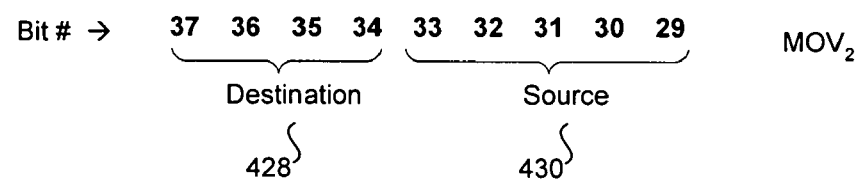

FIG. 4D is a diagram of an exemplary bit arrangement 422 in a MOVE command sequence within the VLIW of FIG. 4A, in accordance with an embodiment of the invention. Referring to FIG. 4D, a move (MOV) command within a VLIW used for V.42bis encoding and/or decoding may comprise 9 bits. More specifically, the MOV command may comprise a source indicator 426 stored in the first 5 bits and a destination indicator 424 stored in the next 4 bits. A second MOV command, MOV2, may also be utilized within a VLIW and during V.42bis processing. The second MOV command, MOV2, may also comprise 9 bits storing a source indicator 430 in the first 5 bits and a destination indicator 428 in the next 4 bits.

In one aspect of the invention, a MOV command may be utilized by a V.42bis hardware accelerator to move filed values from one register within a V.42bis hardware accelerator to another register. The destination indicators 424 and 428, as well as the source indicators 426 and 430 may be associated with any of the following registers, referring to dictionary entries, and/or constant values within the V.42bis hardware accelerator:

| REGISTERS | REGISTER CONTENT TYPE | CONSTANTS |
|---|---|---|
| iSelf | 11-bit index | zero |
| iNext | 11-bit index | one |
| iLast | 11-bit index | three |
| iParent | 11-bit index | five |
| iPrevious | 11-bit index | seventeen |
| iTemp | 11-bit index | thirty-three |
| nextCodeword | 11-bit codeword | |
| increg | 11-bit register | |
| eSelf_char | 8-bit character | |
| eOld_char | 8-bit character | |
| next_char | 8-bit character | |
| length | 8-bit reference | |
| char_Reg | 8-bit character | |
| eSelf | 32-bit entry | |
| eOld | 32-bit entry | |
| status | 8-bit reference | |
| eSelf_brother | 11-bit index | |
| eSelf_child | 11-bit index | |
| eOld_brother | 11-bit index | |
| eOld_child | 11-bit index | |
| charT_index | 11-bit index | |
| maxlength | 8-bit reference | |
| declength | 11-bit reference | |
| prevCodeword | 11-bit codeword | |
| local Cycles | 11-bit reference | |

Figure 4E:
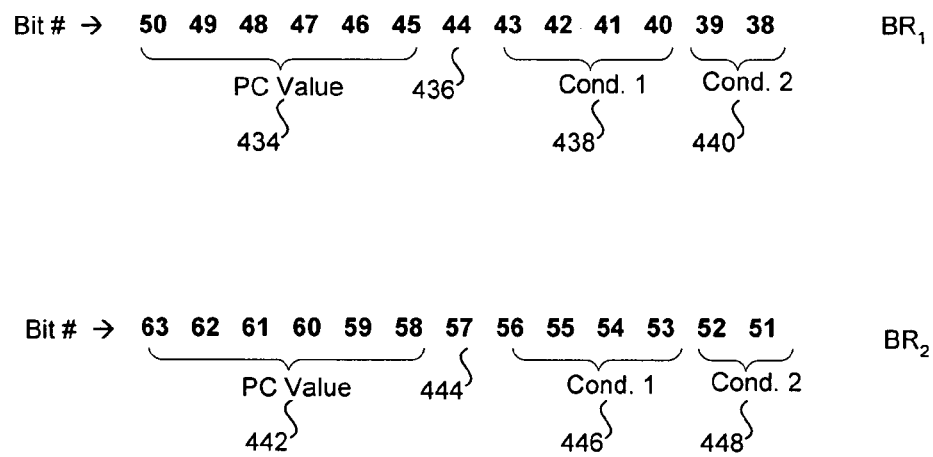
FIG. 4E is a diagram of an exemplary bit arrangement in a BRANCH command sequence within the VLIW of FIG. 4A, in accordance with an embodiment of the invention.

FIG. 4E is a diagram of an exemplary bit arrangement 432 in a BRANCH command sequence within the VLIW of FIG. 4A, in accordance with an embodiment of the invention. Referring to FIG. 4E, a branch (BR) command within a VLIW used for V.42bis encoding and/or decoding may comprise 13 bits. More specifically, a first branch command, BR1, may comprise a program counter value 434, a negating operation 436, a first condition 438 and a second condition 440. A second BR command, BR2, may also be utilized within a VLIW and during V.42bis processing. The BR2 may also comprise 13 bits and may store a program counter value 442, a negating operation 444, a first condition 446 and a second condition 448.

In one aspect of the invention, a BR command may be utilized by a V.42bis hardware accelerator to increase the number of command instructions that may be performed by the V.42bis hardware accelerator within one operational cycle. V.42bis encoding and decoding efficiency may be further increased by including additional BR commands within the same VLIW. For example, the VLIW of FIG. 4A may utilize two BR commands.

During BR command execution, a V.42bis hardware accelerator may verify whether the two conditions within the BR command are valid. If the two conditions are valid, a specific command instruction may be performed. If either condition is invalid, a default instruction may be performed. Referring again to FIG. 4E, BR1 and BR2 commands may be performed sequentially. If condition 438 and condition 440 are valid, a specific command instruction may be performed. If either condition 438 or 440 is invalid, a default instruction may be performed. The specific command instruction or the default instruction may be generated by utilizing the program counter value 434. The first branch command BR1 may then be followed by a second branch command BR2 for increased V.42bis efficiency by processing additional command instructions in the same operating cycle. The first condition indicators 438 and 446 may comprise any of the following conditions:

| CONDITION | DEFINITION |
|---|---|
| NONE | None |
| CHARS_EMPTY | Register CHARS is empty |
| eSelf_youngest | Register eSelf has youngest node |
| local cycles_exc | Local cycles exceeded |
| decode_mode | Current decode mode |
| root_codeword | Root codeword |
| codes_empty | Register CODES empty |
| length_exceeded | Length exceeded |
| eSelf_leaf | Register eSelf has leaf node |
| eOld_leaf | Register eOld has leaf node |
| eOld_youngest | Register eOld has youngest node |
| char_lt | Character less than |
| char_eq | Character equal to |
| char_gt | Character greater than |
| undef_codeword | Undefined codeword |
| cmp_eq | Whether output of a last compare instruction is equal or not |

The second condition indicators 440 and 448 may comprise any of the following conditions:

| CONDITION | DEFINITION |
|---|---|
| NONE | None |
| CHARS_EMPTY | Register CHARS is empty |
| eSelf_youngest | Register eSelf has youngest node |
| eSelf_notyoungest | Register eSelf does not have youngest node |

Figure 4F:
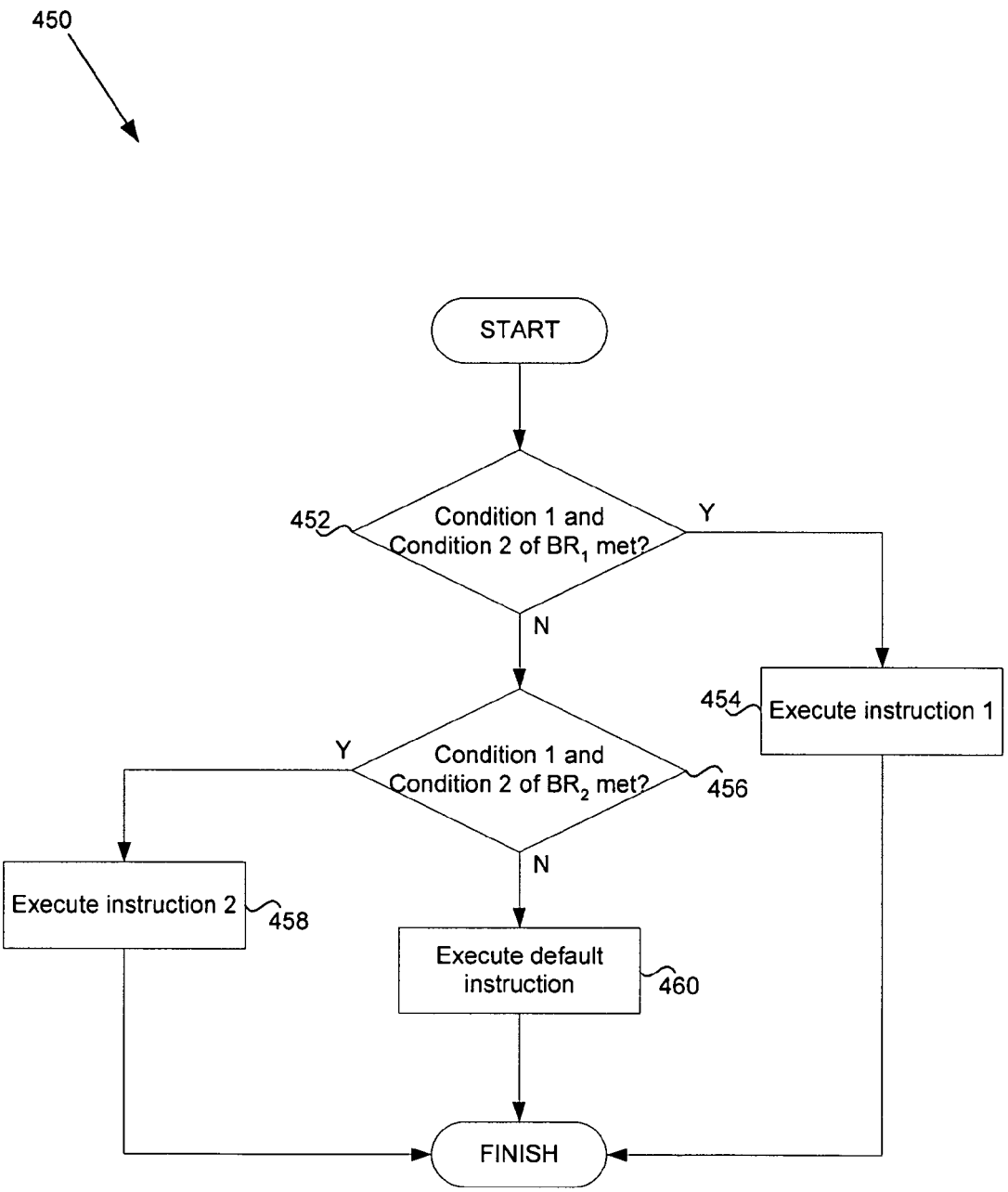
FIG. 4F is a flow diagram of an exemplary method for processing the BRANCH command sequence of FIG. 4E, in accordance with an embodiment of the invention.

FIG. 4F is a flow diagram of an exemplary method 450 for processing the BRANCH command sequence of FIG. 4E, in accordance with an embodiment of the invention. Referring to FIG. 4F, at 452, it may be determined whether a first condition and a second condition within a first branch command, BR1, are met. If the two conditions within BR1 are met, a first processing instruction may be executed at 454. If either of the two conditions are not met, at 456, it may be determined whether a first and a second condition within a second branch command, BR2, are met. If the two conditions within BR2 are met, a second programming instruction may be executed at 458. If either of the two conditions within BR2 are not met, at 460, a default processing instruction may be executed.

Figure 5:
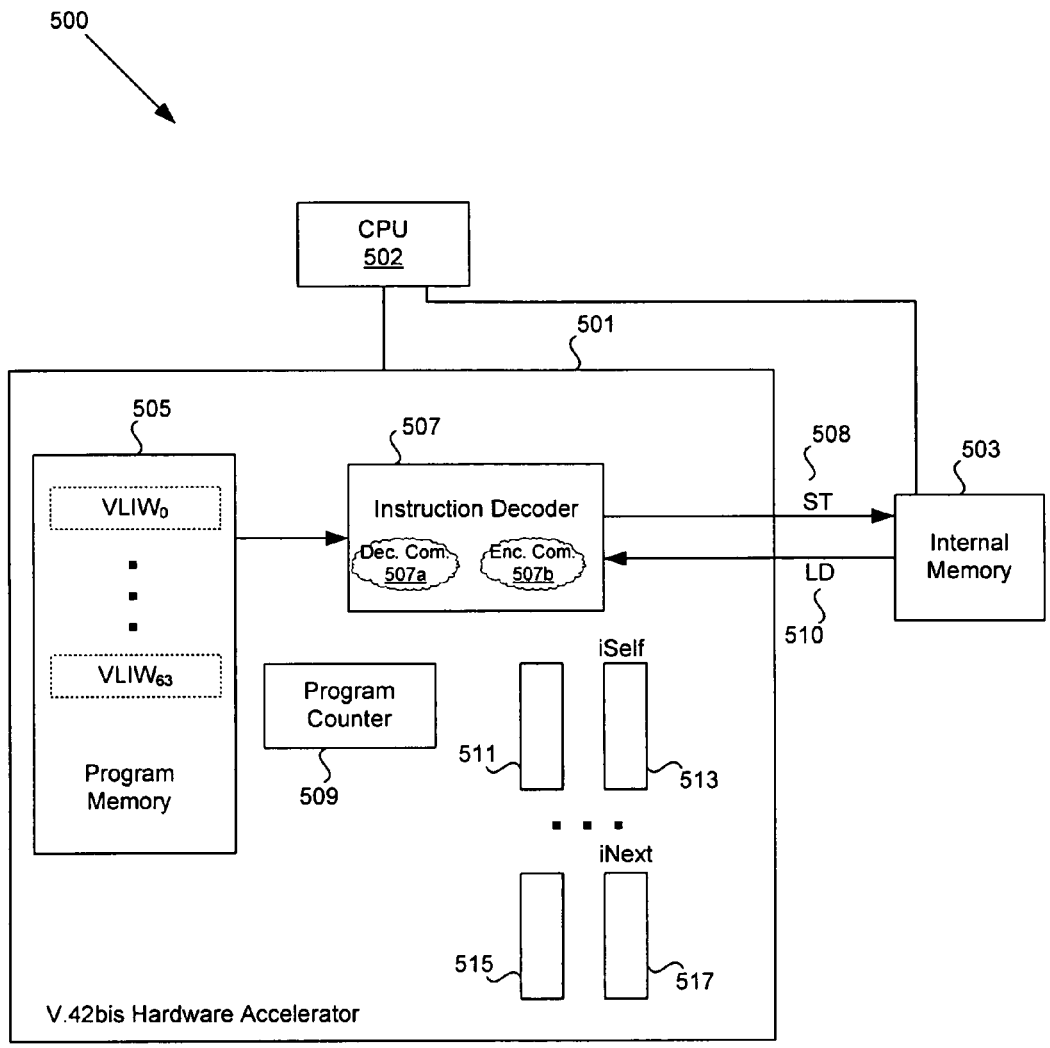
FIG. 5 is a block diagram of an exemplary V.42bis hardware accelerator, in accordance with an embodiment of the invention.

FIG. 5 is a block diagram 500 of an exemplary V.42bis hardware accelerator, in accordance with an embodiment of the invention. The V.42bis hardware accelerator 501 may comprise a program memory 505, an instruction decoder 507, a program counter 509, and a plurality of program registers 511, 513, 515 and 517. The V.42bis hardware accelerator 501 may be coupled to an internal memory 503. The internal memory 503 may reside outside the V.42bis hardware accelerator 501 and may comprise an encoding dictionary, a decoding dictionary, a character set and a codeword space, for example, similar to the configuration of the internal RAM 101 of FIG. 1A. The V.42bis hardware accelerator 501 and/or the internal memory 503 may be embedded in an integrated circuit (IC). Both the V.42bis hardware accelerator 501 and the internal memory 503 may be coupled to a CPU 502. The CPU 502 may be utilized during V.42bis encoding and/or decoding for added efficiency.

The program memory 505 comprises suitable circuitry, logic and/or code and may be adapted to store command instructions in the form of very long instruction words (VLIW). Each of the command instructions within a VLIW stored in the program memory 505 may be associated with specific command operations that may be utilized during V.42bis encoding/decoding.

In one aspect of the invention, the program memory 505 may comprise 64 VLIWs, VLIW0 through VLIW63, each 64 bits long. The program memory 505 may be adapted to communicate one or more VLIWs to the instruction decoder 507. Even though the present invention contemplates a program memory that may utilize 64 VLIWs, 64-bits long, the invention is not limited in this manner. A different number of VLIWs may be utilized, where each VLIW may be of different bit size. In addition, a V.42bis hardware accelerator may utilize a different number of internal registers.

The instruction decoder 507 comprises suitable circuitry, logic and/or code and may be adapted to decode command instructions within a VLIW communicated from the program memory 505. For example, the instruction decoder 507 may be adapted to decode a branch command (BR), a register moving command (MOV), a register setting command (SET), a memory load command (LD), a memory store command (ST), and a register compare command (CMP). After an individual instruction is decoded by the instruction decoder 507, the plurality of registers 511 through 517 may be utilized to process date from the internal memory 503 and to move data between the V.42bis hardware accelerator 501 and the internal memory 503. One or more of the decoded command instructions within a VLIW communicated from the program memory 505 to the instruction decoder 507 may be utilized as a decoding command 507*a* during decoding within the hardware accelerator 501. Similarly, one or more of the decoded command instructions within a VLIW communicated from the program memory 505 to the instruction decoder 507 may be utilized as an encoding command 507*b* during encoding within the hardware accelerator 501. The generated encoding command 507*b* and/or the generated decoding command 507*a* may be performed within the V.42bis hardware accelerator 501 within one operational cycle.

For example, a memory store command 508 may be issued by the instruction decoder 507 and may be communicated to the internal memory 503. After the memory store command 508 is issued by the instruction decoder 507, data may be moved from the program registers 511, 513, 515 and/or 517 and stored in the internal memory 503. More specifically, a dictionary entry may be updated or a codeword and/or a character space may be updated with a new entry. In another aspect of the invention, a memory load command (LD) 510 may be issued by the instruction decoder 507 and may cause the internal memory 503 to communicate data from the internal memory 503 to the V.42bis hardware accelerator 501 for storage at one of the program registers 511, 513, 515 and/or 517.

The program counter 509 may comprise suitable circuitry, logic and/or code and may be adapted to sequence the execution of the operational command instructions generated by the instruction decoder 507 after decoding a VLIW from the program memory 505. In one aspect of the invention, the program counter 509 may be utilized to monitor branch commands (BR) and/or register compare commands (CMP).

In operation, a VLIW may be communicated from the program memory 505 to the instruction decoder 507. The instruction decoder 507 may decode the communicated VLIW and may generate a plurality of command instructions. The generated plurality of command instructions may be performed within the V.42bis hardware accelerator 501 within one operational cycle. During a V.42bis encoding operation, the V.42bis hardware accelerator 501 may obtain a string of characters from a character space within the internal memory 503 and may compare the string of characters with dictionary entries within an encoding dictionary.

If the string of characters is not matched with a dictionary entry, the V.42bis hardware accelerator 501 may utilize the load command 510 to load the string of characters for encoding. One or more VLIWs from the program memory 505 may be decoded by the instruction decoder 507 to generate a plurality of command instructions used for encoding. The generated command instructions may be applied to the string of characters to generate a codeword. During encoding, the plurality of registers 511 through 517 may be utilized, as well as the load and store commands 510 and 508 to exchange information between the internal memory 503 and the V.42bis hardware accelerator 501 needed for encoding. The encoded stream of characters in the form of a codeword may be communicated back to the internal memory 503 for further processing.

During a V.42bis decoding operation, the V.42bis hardware accelerator 501 may obtain a codeword from a codeword space within the internal memory 503 and may compare the codeword with codeword entries within a decoding dictionary. If the codeword is not matched with a codeword entry, the V.42bis hardware accelerator 501 may utilize the load command 510 to load the codeword for decoding. One or more VLIWs from the program memory 505 may be decoded by the instruction decoder 507 to generate a plurality of command instructions used for decoding. The generated command instructions may be applied to the codeword to generate a string of characters. During decoding, the plurality of registers 511 through 517 may be utilized, as well as the load and store commands 510 and 508 to exchange information between the internal memory 503 and the V.42bis hardware accelerator 501 needed for decoding. The decoded codeword in the form of a string of characters may be communicated back to the internal memory 503 for further processing.

In a different aspect of the invention, the encoding and decoding operations within the V.42bis hardware accelerator 501 may utilize the following pseudocode to perform encoding, or compression, and decoding, or decompression:

---

```
LZW Compression
ROUTINE LZW_COMP
STRING = get input character
WHILE (there are still input character) DO
    CHARACTER = get input character
    IF STRING & CHARACTER is in the STABLE THEN
        STRING = STRING & CHARACTER
    ELSE
        output the codeword for STRING
        add STRING & CHARACTER to the S_TABLE
```

```
            STRING = CHRACTER
        END IF
    END WHILE
    output the codeword for STRING
LZW Decompression
ROUTINE LZW_DECOMP
    read NEW_CODE
    output NEW-CODE
    OLD_CODE = NEW_CODE
    WHILE (there are still input codes) Do
        read NEW_CODE
        STRING = get translation of NEW_CODE
        output STRING
        add (get translation of OLD_CODE) &
            CHARACTER to the S_TABLE
        OLD_CODE = NEW_CODE
    END WHILE
```

Accordingly, aspects of the invention may be realized in hardware, software, firmware or a combination thereof. The invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware, software and firmware may be a general-purpose computer system with a computer program that, when being loaded and executed, controls the computer system such that it carries out the methods described herein.

One embodiment of the present invention may be implemented as a board level product, as a single chip, application specific integrated circuit (ASIC), or with varying levels integrated on a single chip with other portions of the system as separate components. The degree of integration of the system will primarily be determined by speed and cost considerations. Because of the sophisticated nature of modern processors, it is possible to utilize a commercially available processor, which may be implemented external to an ASIC implementation of the present system. Alternatively, if the processor is available as an ASIC core or logic block, then the commercially available processor may be implemented as part of an ASIC device with various functions implemented as firmware.

The invention may also be embedded in a computer program product, which comprises all the features enabling the implementation of the methods described herein, and which when loaded in a computer system is able to carry out these methods. Computer program in the present context may mean, for example, any expression, in any language, code or notation, of a set of instructions intended to cause a system having an information processing capability to perform a particular function either directly or after either or both of the following: a) conversion to another language, code or notation; b) reproduction in a different material form. However, other meanings of computer program within the understanding of those skilled in the art are also contemplated by the present invention.

While the invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims.

What is claimed is:

1. A method for on-chip processing of data, the method comprising:
    generating a plurality of data processing commands for data compression; and
    encoding a first string of characters in one operating cycle utilizing said generated plurality of data processing commands for data compression,
    wherein said plurality of data processing commands and said first string of characters are stored in a single on-chip memory utilizing a character tree structure proceeding from at least one leaf node to at least one root node during said one operating cycle.

2. The method according to claim 1, further comprising generating a plurality of data processing commands for data decompression.

3. The method according to claim 2, further comprising decoding at least one codeword in one operating cycle utilizing said generated plurality of data processing commands for data decompression.

4. The method according to claim 3, further comprising matching said at least one codeword with a second string of characters.

5. The method according to claim 4, further comprising storing said matched second string of characters into a character space.

6. The method according to claim 1, further comprising acquiring said first string of characters from a character space.

7. The method according to claim 6, further comprising matching said acquired first string of characters with at least one existing codeword.

8. The method according to claim 7, further comprising storing said matched at least one existing codeword into a codeword space.

9. The method according to claim 7, further comprising generating a new codeword corresponding to said acquired first string of characters, if said acquired first string of characters does not match said at least one existing codeword.

10. The method according to claim 1, further comprising decoding at least a portion of said stored data processing commands.

11. The method according to claim 10, further comprising sequencing said decoded at least a portion of said stored data processing commands.

12. The method according to claim 1, wherein said plurality of data processing commands comprise at least one of the following: a branch command, a register moving command, a register setting command, a memory load command, a memory store command, and a register compare command.

13. A machine-readable storage having stored thereon, a computer program having at least one code section for on-chip processing of data, the at least one code section being executable by a machine for causing the machine to perform steps comprising:
    generating a plurality of data processing commands for data compression; and
    encoding a first string of characters in one operating cycle utilizing said generated plurality of data processing commands for data compression,
    wherein said plurality of data processing commands and said first string of characters are stored in a single on-chip memory utilizing a character tree structure proceeding from at least one leaf node to at least one root node during said one operating cycle.

14. The machine-readable storage according to claim 13, further comprising code for generating a plurality of data processing commands for data decompression.

15. The machine-readable storage according to claim 14, further comprising code for decoding at least one codeword in one operating cycle utilizing said generated plurality of data processing commands for data decompression.

16. The machine-readable storage according to claim 15, further comprising code for matching said at least one codeword with a second string of characters.

17. The machine-readable storage according to claim 16, further comprising code for storing said matched second string of characters into a character space.

18. The machine-readable storage according to claim 13, further comprising code for acquiring said first string of characters from a character space.

19. The machine-readable storage according to claim 18, further comprising code for matching said acquired first string of characters with at least one existing codeword.

20. The machine-readable storage according to claim 19, further comprising code for storing said matched at least one existing codeword into a codeword space.

21. The machine-readable storage according to claim 19, further comprising code for generating a new codeword corresponding to said acquired first string of characters, if said acquired first string of characters does not match said at least one existing codeword.

22. The machine-readable storage according to claim 13, further comprising code for decoding at least a portion of said stored data processing commands.

23. The machine-readable storage according to claim 22, further comprising sequencing said decoded at least a portion of said stored data processing commands.

24. The machine-readable storage according to claim 13, wherein said plurality of data processing commands comprise at least one of the following: a branch command, a register moving command, a register setting command, a memory load command, a memory store command, and a register compare command.

25. A system for on-chip processing of data, the system comprising:
an accelerator that generates a plurality of data processing commands for data compression; and
said accelerator encodes a first string of characters in one operating cycle utilizing said generated plurality of data processing commands for data compression,
wherein said plurality of data processing commands and said first string of characters are stored in a single on-chip memory utilizing a character tree structure proceeding from at least one leaf node to at least one root node during said one operating cycle.

26. The system according to claim 25, wherein said accelerator generates a plurality of data processing commands for data decompression.

27. The system according to claim 26, wherein said accelerator decodes at least one codeword in one operating cycle utilizing said generated plurality of data processing commands for data decompression.

28. The system according to claim 27, wherein said accelerator matches said at least one codeword with a second string of characters.

29. The system according to claim 28, wherein said accelerator stores said matched second string of characters into a character space.

30. The system according to claim 25, wherein said accelerator acquires said first string of characters from a character space.

31. The system according to claim 30, wherein said accelerator matches said acquired first string of characters with at least one existing codeword.

32. The system according to claim 31, wherein said accelerator stores said matched at least one existing codeword into a codeword space.

33. The system according to claim 31, wherein said accelerator generates a new codeword corresponding to said acquired first string of characters, if said acquired first string of characters does not match said at least one existing codeword.

34. The system according to claim 27, wherein said accelerator decodes at least a portion of said stored data processing commands.

35. The system according to claim 34, wherein said accelerator sequences said decoded at least a portion of said stored data processing commands.

36. The system according to claim 25, wherein said plurality of data processing commands comprise at least one of the following: a branch command, a register moving command, a register setting command, a memory load command, a memory store command, and a register compare command.

* * * * *